United States Patent
Kim et al.

(10) Patent No.: US 10,347,686 B2
(45) Date of Patent: Jul. 9, 2019

(54) OPTICAL SENSOR

(71) Applicants: SAMSUNG ELECTRONICS CO., LTD., Suwon-si (KR); INDUSTRY-ACADEMIC COOPERATION FOUNDATION, YONSEI UNIVERSITY, Seoul (KR)

(72) Inventors: Unjeong Kim, Osan-si (KR); Younggeun Roh, Seoul (KR); Jaeseok Kim, Seoul (KR); Chihun In, Seoul (KR); Hyunyong Choi, Seoul (KR); Jaehyun Kwon, Hwaseong-si (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/805,743

(22) Filed: Nov. 7, 2017

(65) Prior Publication Data

US 2018/0138231 A1    May 17, 2018

(30) Foreign Application Priority Data

Nov. 15, 2016 (KR) .......... 10-2016-0152228

(51) Int. Cl.
*H01L 29/78* (2006.01)
*H01L 27/146* (2006.01)
(Continued)

(52) U.S. Cl.
CPC .... *H01L 27/14649* (2013.01); *H01L 27/1462* (2013.01); *H01L 27/14625* (2013.01); *H01L 31/028* (2013.01); *H01L 31/0232* (2013.01); *H01L 31/0296* (2013.01); *H01L 31/08* (2013.01); *H01L 31/09* (2013.01); *H01L 31/112* (2013.01); *H01L 43/08* (2013.01);
(Continued)

(58) Field of Classification Search
CPC combination set(s) only.
See application file for complete search history.

(56) References Cited

U.S. PATENT DOCUMENTS 6,130,147 A    10/2000  Major et al.
2007/0110358 A1    5/2007  Hu et al.
(Continued)

FOREIGN PATENT DOCUMENTS

KR    10-1243183 B1    3/2013
KR    10-2013-0126949 A    11/2013

OTHER PUBLICATIONS

Zheng, et al., "Patterning two-dimensional chalcogenide crystals of $Bi_2Se_3$ and $In_2Se_3$ and efficient photodetectors" Apr. 2015, Nature Communications, ncomms7972, 8 pages total.
(Continued)

*Primary Examiner* — Moin M Rahman
(74) *Attorney, Agent, or Firm* — Sughrue Mion, PLLC

(57) ABSTRACT

An optical sensor is disclosed. The optical sensor may include a substrate, a topological insulator layer formed on the substrate, an oxide layer formed on the topological insulator layer, a graphene layer stacked on the oxide layer, and a dielectric layer covering the graphene layer.

16 Claims, 14 Drawing Sheets

(51) Int. Cl.
*H01L 31/0232* (2014.01)
*H01L 31/0296* (2006.01)
*H01L 31/08* (2006.01)
*H01L 43/08* (2006.01)
*H01L 31/028* (2006.01)
*H01L 31/09* (2006.01)
*H01L 31/112* (2006.01)
*H01F 1/00* (2006.01)
*H01L 49/00* (2006.01)

(52) U.S. Cl.
CPC .......... *H01F 1/0009* (2013.01); *H01L 29/785* (2013.01); *H01L 49/006* (2013.01); *Y02E 10/547* (2013.01)

(56) References Cited

U.S. PATENT DOCUMENTS

2015/0346032 A1 12/2015 Baleine et al.
2017/0263726 A1* 9/2017 Huang .............. G02F 1/134309

OTHER PUBLICATIONS

Qiao, et al., "Broadband Photodetector Based on Graphene-$Bi_2Te_3$ Heterostructure" Jan. 2015, ACS Nano, vol. 9, Issue No. 2, 10 pages total.

Yao, et al., "Broad Electrical Tuning of Graphene-Loaded Plasmonic Antennas" Feb. 26, 2013, Nano Letters, vol. 13, pp. 1257-1264.

Liu, et al., "Graphene photodetectors with ultra-broadband and high responsivity at room temperature", Mar. 2014, Nature Nanotechnology, vol. 9, pp. 273-278.

Wang, et al., "High-responsivity graphene/silicon-heterostructure waveguide photodetectors" Sep. 2013, Nature Photonics, vol. 7, pp. 888-891.

Konstantatos, et al., "Hybrid graphene-quantum dot phototransistors with ultrahigh gain" May 2012, Nature Nanotechnology, vol. 7, pp. 363-368.

Yao, et al., "High-Responsivity Mid-Infrared Graphene Detectors with Antenna-Enhanced Photocarrier Generation and Collection" Jun. 2014, Nano Letters, vol. 14, pp. 3749-3754.

Zhang, et al., "Broadband high photoresponse from pure monolayer graphene photodetector" May 2013, Nature Communications, 11 pages total.

Ou, et al., "Ultraviolet and visible range plasmonics in the topological insulator $Bi_{1.5}Sb_{0.5}Te_{1.8}Se_{1.2}$", Oct. 2014, Nature Communications, vol. 5, Article No. 5139, 39 pages total.

Ando, Y., "Topological Insulator Materials" 2013, Journal of the Physical Society of Japan, vol. 82, 32 pages total.

* cited by examiner

OPTICAL SENSOR

CROSS-REFERENCE TO RELATED APPLICATION

This application claims priority from Korean Patent Application No. 10-2016-0152228, filed on Nov. 15, 2016, in the Korean Intellectual Property Office, the disclosure of which is incorporated herein in its entirety by reference.

BACKGROUND

1. Field

The present disclosure relates to an optical sensor, and more particularly, to an optical sensor capable of detecting light of an infrared (IR) region.

2. Description of the Related Art

To equip a mobile health device with a sensor for diagnosing glucose in blood or the like, an optical sensor capable of detecting a phonon of a target object in an IR region without using a spectrometer is needed.

Since existing optical sensors in the IR region require a cooling system, a system volume is large, and thus, it is difficult to use the existing optical sensors in a mobile health device.

Therefore, the development of an optical sensor using a nanomaterial is demanded. Since graphene, which is a popular nanomaterial candidate, reacts in a consistent manner across almost all wavelengths, graphene typically exhibits no reaction wavelength selectivity. In addition, since graphene also has low optical efficiency, graphene has low responsivity. Therefore, in order to apply graphene to an optical sensor, supplementation is required to improve the reaction wavelength selectivity and the responsivity.

SUMMARY

Provided is an optical sensor of which reaction wavelength selectivity and responsivity are improved by applying graphene thereto.

Additional aspects will be set forth in part in the description which follows and, in part, will be apparent from the description, or may be learned by practice of the presented exemplary embodiments.

According to an aspect of an exemplary embodiment, an optical sensor may include: a substrate; a topological insulator layer formed on the substrate; an oxide layer formed on the topological insulator layer; a graphene layer stacked on the oxide layer; and a dielectric layer covering the graphene layer.

The topological insulator layer may be patterned so as to form a metamaterial and include a unit-cell array of the metamaterial.

A unit cell of the unit-cell array may have a slit pattern having at least one of a cross shape, an X shape, and an I shape.

Stacked structures of the topological insulator layer and the graphene layer may be provided. The stacked structures may have an overlapping region of the topological insulator layer and the graphene layer. The topological insulator layer may extend in a first direction, and the graphene layer may extend in a second direction other than the first direction.

The first direction and the second direction may cross each other.

An array of the stacked structures of the topological insulator layer and the graphene layer may be provided.

Electrodes may be provided at both ends of the graphene layer.

The oxide layer may have a thickness of 10 nm or less.

The dielectric layer may be an ion gel layer including ion gel.

The optical sensor may further include a side gate electrode electrically connected to the ion gel layer and configured to gate the ion gel layer to adjust a graphene Fermi level of the graphene layer.

The graphene Fermi level of the graphene layer may be adjusted by an amount in a range of 1-2 μm through the ion gel layer to tune a resonance absorption location of the topological insulator layer.

The topological insulator layer may be prepared such that resonance absorption occurs within a range of about 3-4 μm.

BRIEF DESCRIPTION OF THE DRAWINGS

The above and/or other aspects will become apparent and more readily appreciated from the following description of various exemplary embodiments, taken in conjunction with the accompanying drawings in which.

DETAILED DESCRIPTION

Figure 1:
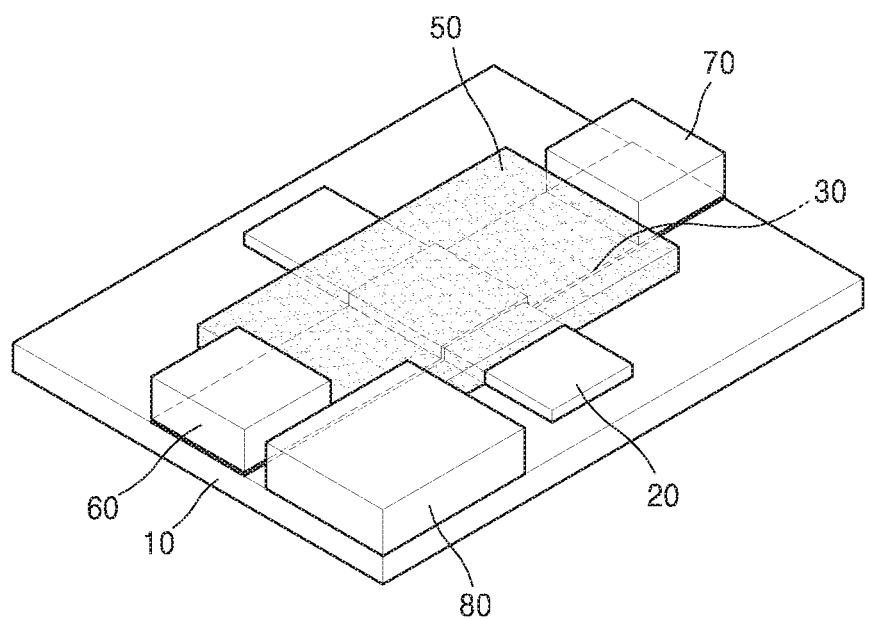
FIG. 1 is a perspective view of an optical sensor according to an exemplary embodiment.

Reference will now be made in detail to exemplary embodiments, which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects.

Hereinafter, an optical sensor according to various exemplary embodiments will be described in detail with reference to the accompanying drawings. Like reference numerals in the drawings refer to like elements, and the sizes or thicknesses of components may be exaggerated for convenience of description. The exemplary embodiments described below are only illustrative, and various modifications can be made from these exemplary embodiments. In the specification, when it is described that one layer is provided "on," "on an upper part of," or "above" another layer or a substrate, the layer may be provided on another layer or the substrate directly or via another layer in the middle.

Figure 2:
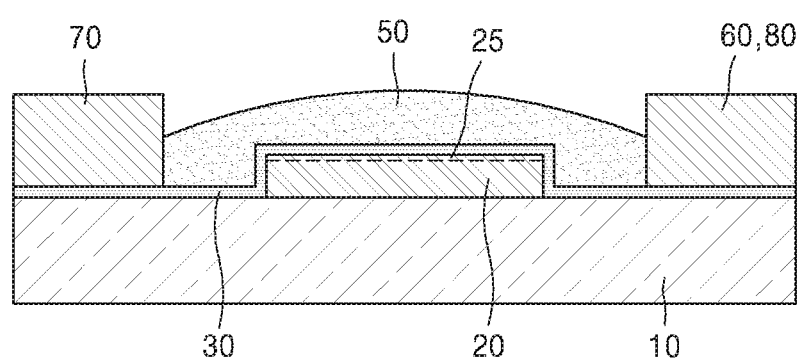
FIG. 2 is a cross-sectional view of FIG. 1.

FIG. 1 is a perspective view of an optical sensor according to an exemplary embodiment, and FIG. 2 is a cross-sectional view of FIG. 1.

Referring to FIGS. 1 and 2, the optical sensor includes a substrate 10, a topological insulator layer 20 formed on the substrate 10, an oxide layer 25 formed on the topological insulator layer 20, a graphene layer 30 stacked on the oxide layer 25, and a dielectric layer (e.g., an ion gel layer) 50 covering the graphene layer 30.

The substrate 10 may be formed of a material of which an energy band gap is large. For example, the substrate 10 may be formed of a material of which an energy band gap is greater than energy of sensing light of the optical sensor. For example, the substrate 10 may be a sapphire substrate of which an energy band gap is large.

A topological insulator of the topological insulator layer 20 is an electrical insulator but has an attribute that a surface thereof is conductive. For example, tin (Sn), bismuth (Bi), iridium (Ir), niobium (Nb), and the like have a two-dimensional surface and exhibits this characteristic.

In the optical sensor according to an exemplary embodiment, the topological insulator layer 20 includes a topological insulator material and may be an n type. The topological insulator layer 20 may have a band gap of an infrared (IR) region, e.g., a mid-IR region. The topological insulator layer 20 may have a band gap of a near IR (NIR) region or a far IR (FIR) region. Hereinafter, a case in which light of the mid-IR region is incident to the optical sensor and resonance absorption in the mid-IR region occurs in the topological insulator layer 20 is illustrated, but this is only illustrative, and the optical sensor may sense not only light of the mid-IR region but also light of the FIR or NIR region.

The oxide layer 25 of several nanometers, which has been naturally formed, may exist on the surface of the topological insulator layer 20. The oxide layer 25 may be separately formed on the topological insulator layer 20. Although FIG. 2 shows that the oxide layer 25 is a separate layer from the topological insulator layer 20, the oxide layer 25 may not be separated as a layer from the topological insulator layer 20 and may only function as a tunneling-enabled energy barrier between the topological insulator layer 20 and the graphene layer 30.

The topological insulator layer 20 may include a topological insulator including Bi and selenium (Se) compositions. For example, the topological insulator layer 20 may be formed of $Bi_2Se_3$. The topological insulator layer 20 may be formed of any one of $Bi_{1-x}Sb_x$, $Bi_2Te_2Se$, $(Bi,Sb)_2Te_3$, $Bi_{2-x}Sb_xTe_{3-y}Se_y$, $Bi_{1.2}Sb_{0.9}Te_2S$, $SmB_6$.

The topological insulator layer 20 may be patterned so as to form a metamaterial. That is, the topological insulator layer 20 may include a unit-cell array of the metamaterial.

In the optical sensor, the oxide layer 25 may be formed to be thin such that tunneling is enabled between the topological insulator layer 20 and the graphene layer 30. For example, the oxide layer 25 may be formed with a thickness of 10 nm or less.

Figure 3:
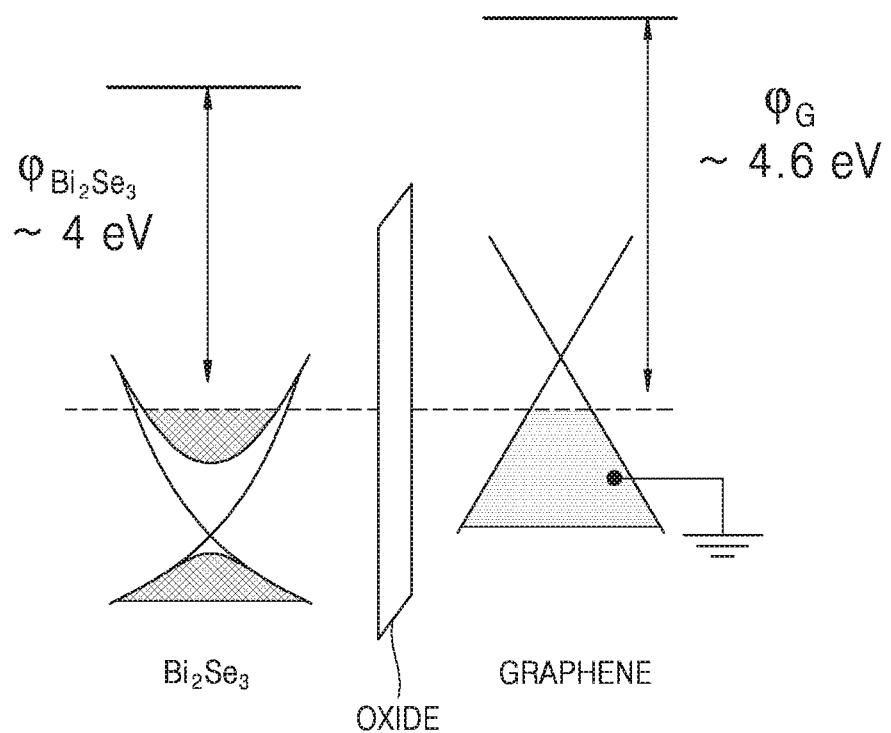
FIG. 3 illustrates band alignment between $Bi_2Se_3$ and graphene when $Bi_2Se_3$ is applied to a topological insulator layer.

Graphene may be a p type in the air. Therefore, when the topological insulator layer 20 and the graphene layer 30 are bonded as in the optical sensor, band alignment between the topological insulator layer 20 and the graphene layer 30 may be achieved as shown in FIG. 3. FIG. 3 illustrates band alignment between $Bi_2Se_3$ and graphene when $Bi_2Se_3$ is applied to the topological insulator layer 20. Although a barrier of the oxide layer 25 is formed between $Bi_2Se_3$ and graphene, carriers may tunnel through the barrier of the oxide layer 25.

Referring back to FIGS. 1 and 2, the topological insulator layer 20 and the graphene layer 30 may be formed in a stacked structure such that the topological insulator layer 20 extends in a first direction, the graphene layer 30 extends in a second direction other than the first direction, e.g., a direction crossing the first direction, and an overlapping region of the topological insulator layer 20 and the graphene layer 30 exists. That is, the topological insulator layer 20 and the graphene layer 30 may extend in directions crossing each other.

Electrodes 60 and 70 may be provided at both ends of the graphene layer 30 such that a current change due to sensed light is detected when light is incident to the optical sensor. For example, a drain electrode 60 may be provided to one end of the graphene layer 30, and a source electrode 70 may be provided to the other end of the graphene layer 30. The drain electrode 60 and the source electrode 70 may be formed in a structure in which the drain electrode 60 and the source electrode 70 are stacked on the graphene layer 30 at both ends of the graphene layer 30. Herein, the drain electrode 60 and the source electrode 70 may be formed of various metallic materials applied as an electrode, such as gold (Au).

The dielectric layer (e.g., the ion gel layer) 50 is formed so as to cover the graphene layer 30 and may be formed so as to cover at least a region of the graphene layer 30 in which sensing light is received, the region including a portion of the graphene layer 30 corresponding to the overlapping region of the topological insulator layer 20 and the graphene layer 30.

Ion gel may include a mixture of an ionic liquid and a polymer binder. The ionic liquid has good chemical stability and may have a wide electrochemical window. The ionic liquid may include cations and anions.

The ionic liquid may be any one selected from among, for example, 1-ethyl-3-methylimidazolium thiocyanate (EMIM-SCN), 1-ethyl-3-methylimidazolium dicyanamide (EMIM-DCA), 1-ethyl-3-methylimidazolium tetrafluoroborate (EMIM-BF4), 1-ethyl-3-methylimidazolium trifluoromethanesulfonate (EMIM-OTF), 1-ethyl-3-methylimidazolium bi(trifluoromethanesulfonyl)imide (EMIM-NTf2), 1-methyl-3-methylimidazolium bi(trifluoromethanesulfonyl)imide (DMIM-NTf2), 1-propyl-3-methylimidazolium bi(trifluoromethanesulfonyl)imide (PMIM-NTf2), 1-butyl-1-methylpyrrolidinium bi(trifluoromethanesulfonyl)imide (BMPyr-NTf2), and 1-butyl-3-methylpyridinium bi(trifluoromethanesulfonyl)imide (BMPy-NTf2).

The polymer binder may include an ultraviolet (UV)-curable polymer which is cured by UV rays. In this case, the polymer binder may be cured according to activation of a predetermined photoinitiator by UV rays. The polymer binder may include a block copolymer instead of the UV-curable polymer. The block copolymer may be, for example, a triblock copolymer. For the polymer binder, any one of, for example, poly(vinylidene fluoride-co-hexafluoropropylene) (P(VDF-HFP)), poly(styrene-block-ethylene oxide-block-styrene) (PSPEOPS), and poly(styrene-block-methylmethacrylate-block-styrene) (PSPMMAPS) may be applied.

By mixing the ionic liquid and the polymer binder and inducing binder crosslinking, a gel-phase material in which the ionic liquid exists between crosslinked polymers, i.e., ion gel, may be obtained. The ion gel may have a relatively high dielectric constant. For example, the ion gel may have a dielectric constant of about 10 or more. Therefore, when the ion gel is applied as the dielectric layer so as to act as a gate-insulating layer in the optical sensor, gate driving may be enabled with a less electrical field than a case in which an existing oxide insulating layer is applied as the gate-insulating layer. In addition, the ion gel may have a flexible/stretchable characteristic and also have a transparent characteristic.

Although a case in which the dielectric layer is the ion gel layer 50 formed of the ion gel is illustrated in FIGS. 1 and 2, this is only illustrative, and the present disclosure is not limited thereto. The dielectric layer may be formed of various dielectric materials by which gating is enabled instead of the ion gel.

The optical sensor may further include a side gate electrode 80 electrically connected to the ion gel layer 50 so as to adjust a graphene Fermi level of the graphene layer 30 by gating the ion gel layer 50.

The topological insulator layer 20 may be prepared such that resonance absorption occurs within a wavelength range of about 3-4 µm, which is the IR region, e.g., the mid-IR range, and when a Fermi level of graphene is adjusted by applying a gate voltage to the ion gel layer 50 through the side gate electrode 80, a resonance absorption location of the topological insulator layer 20 may be adjusted by, for example, about 1-2 µm, and thus a resonance wavelength of the topological insulator layer 20 may be tuned. As described above, the resonance wavelength of the topological insulator layer 20 may be tuned up to about 1-2 µm.

Figure 4A:
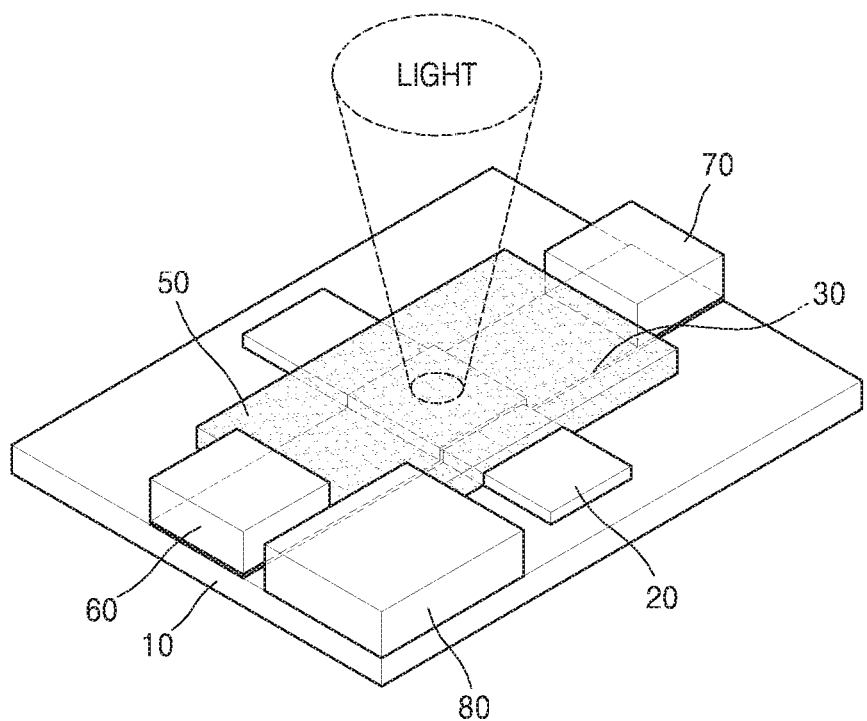
FIG. 4A shows an example in which sensing light is incident to the optical sensor according to an exemplary embodiment.
Figure 4B:
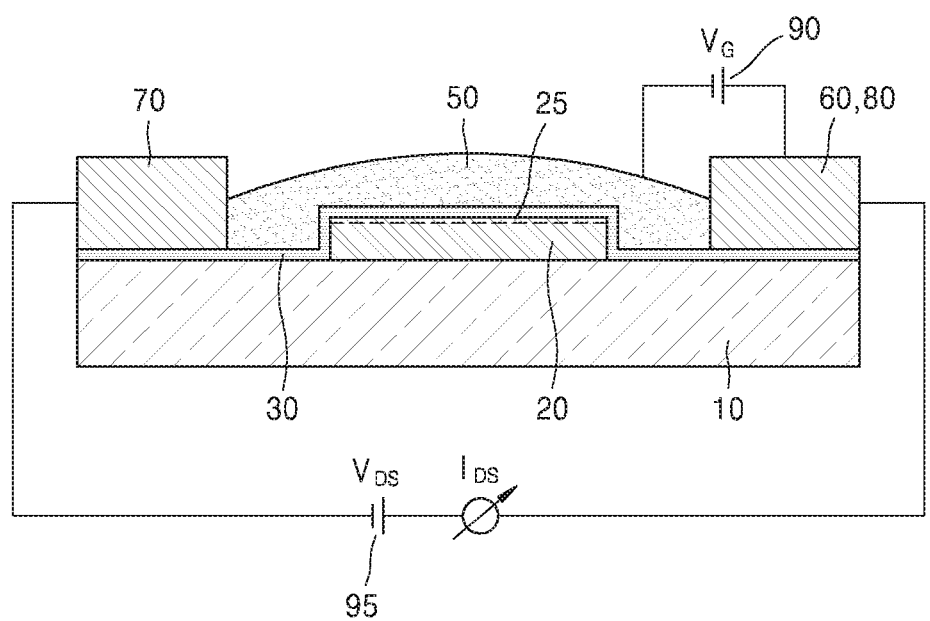
FIG. 4B illustrates an operating state in which a current change due to incident sensing light is detected through electrodes at both ends of a graphene layer.

FIG. 4A shows an example in which sensing light is incident to the optical sensor according to an exemplary embodiment. FIG. 4B illustrates an operating state in which a current change due to the incident sensing light is detected through the electrodes, i.e., the drain electrode 60 and the source electrode 70, at both ends of the graphene layer 30. In FIG. 4B, for convenience of drawing, the drain electrode 60 and the side gate electrode 80 are shown at the same location.

Referring to FIG. 4B, a voltage, e.g., a drain-source voltage $V_{DS}$, may be applied between the electrodes, i.e., the drain electrode 60 and the source electrode 70, at both ends of the graphene layer 30, and a current $I_{DS}$ due to the incident sensing light may be detected through the electrodes, i.e., the drain electrode 60 and the source electrode 70, at both ends of the graphene layer 30. In addition, the Fermi level of the graphene may be adjusted by gating the graphene through the ion gel layer 50 employing the ion gel. A gating voltage $V_G$ may be applied between the ion gel layer 50 employing the ion gel and the side gate electrode 80 to adjust the Fermi level of the graphene, and the Fermi level of the graphene may be adjusted by adjusting the gating voltage $V_G$.

Figure 5:
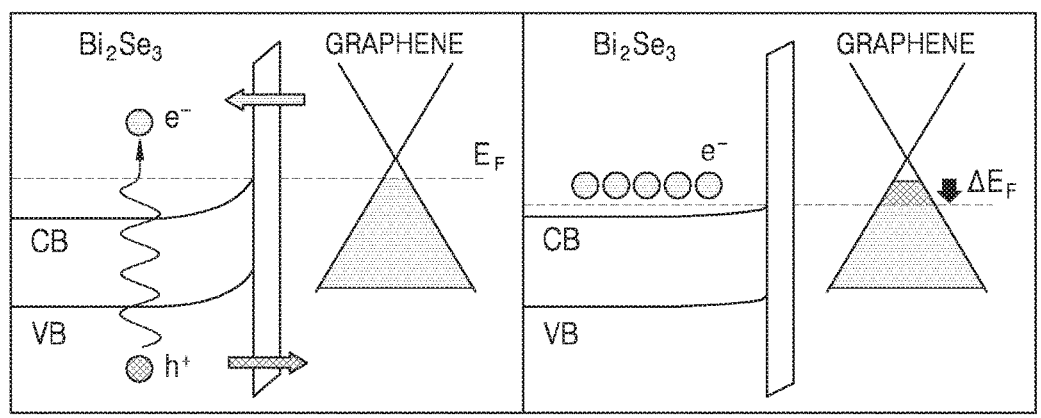
FIG. 5 illustrates movement of electrons and a photogating effect in the graphene according to an exemplary embodiment as shown in FIG. 4A.
Figure 6A:
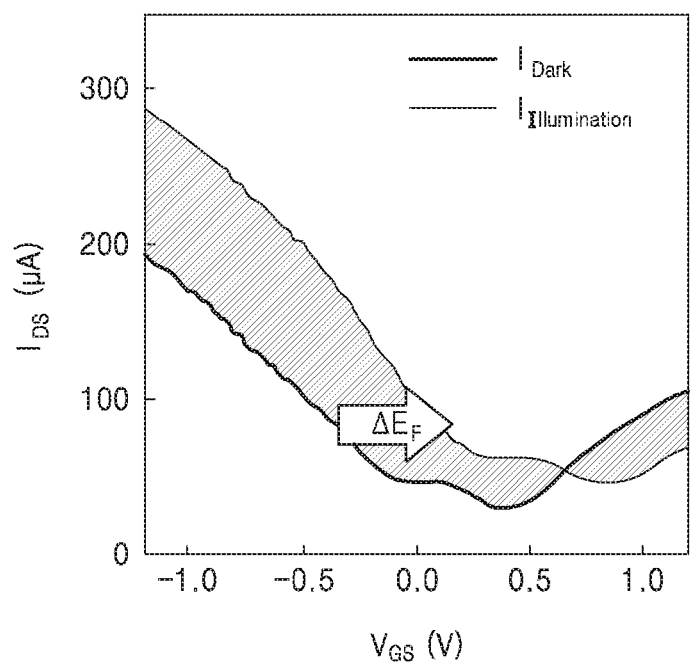
FIGS. 6A and 6B are graphs showing a current change detected through the electrodes at both ends of the graphene layer according to an exemplary embodiment.
Figure 6B:
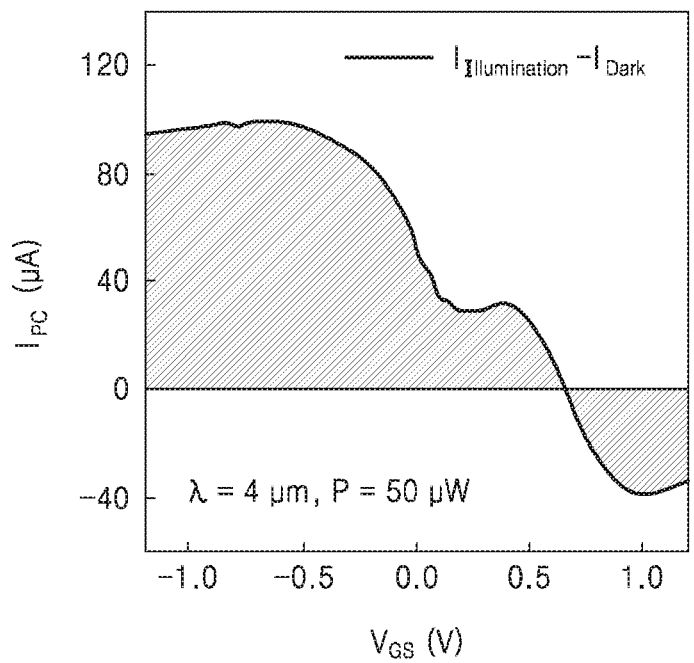

FIG. 5 illustrates movement of electrons and holes between the topological insulator layer 20 (e.g., $Bi_2Se_3$) and graphene, and a photo-gating effect in the graphene according to the movement when light of the mid-IR region of which a wavelength is about $\lambda=3.5$ µm is illuminated on the optical sensor according to an exemplary embodiment as shown in FIG. 4A. FIGS. 6A and 6B are graphs showing a current change detected through the electrodes 60 and 70 at both ends of the graphene layer 30 when no light is illuminated on the optical sensor ($I_{Dark}$) and when light is illuminated on the optical sensor ($I_{Illumination}$).

Referring to the left portion of FIG. 5, when light of the mid-IR region of which a wavelength is about $\lambda=3.5$ µm is illuminated on the optical sensor, electrons of $Bi_2Se_3$ forming the topological insulator layer 20 are excited, and thus, holes are transferred to the graphene, and the electrons cross over a conduction band (CB) of $Bi_2Se_3$. Accordingly, as shown in the right portion of FIG. 5, a photo-gating effect instantaneously occurs in the graphene due to the electrons gathered in $Bi_2Se_3$ to thereby decrease the Fermi level of the graphene by $\Delta E_F$, and thus, a p-type doping effect occurs during the illumination of the light. Therefore, a threshold voltage of an IV curve may move towards a positive side, thereby inducing a photocurrent. In FIG. 5, VB stands for valence band.

FIG. 6A is a graph showing a change in the current $I_{DS}$ detected through the electrodes 60 and 70 at both ends of the graphene layer 30 when no light is illuminated on the optical sensor ($I_{Dark}$) and when light is illuminated on the optical sensor ($I_{Illumination}$). FIG. 6B is a graph showing a photocurrent obtained by the current change of FIG. 6A. In the graphs of FIGS. 6A and 6B, a horizontal axis indicates a gate voltage $V_{GS}$.

As shown in FIG. 6A, in a certain range of the gate voltage $V_{GS}$, the current $I_{DS}$ detected through the electrodes 60 and 70 at both ends of the graphene layer 30 is greater when light is illuminated on the optical sensor ($I_{Illumination}$) than when no light is illuminated on the optical sensor ($I_{Dark}$), thereby causing the Fermi level of the graphene to be lowered. Accordingly, as shown in FIG. 6B, a photocurrent $I_{PC}$ may be induced. The induced photocurrent $I_{PC}$ may correspond to a value obtained by subtracting the current $I_{Dark}$ obtained when no light is illuminated on the optical sensor from the current $I_{Illumination}$ obtained when light is illuminated on the optical sensor.

Figure 7A:
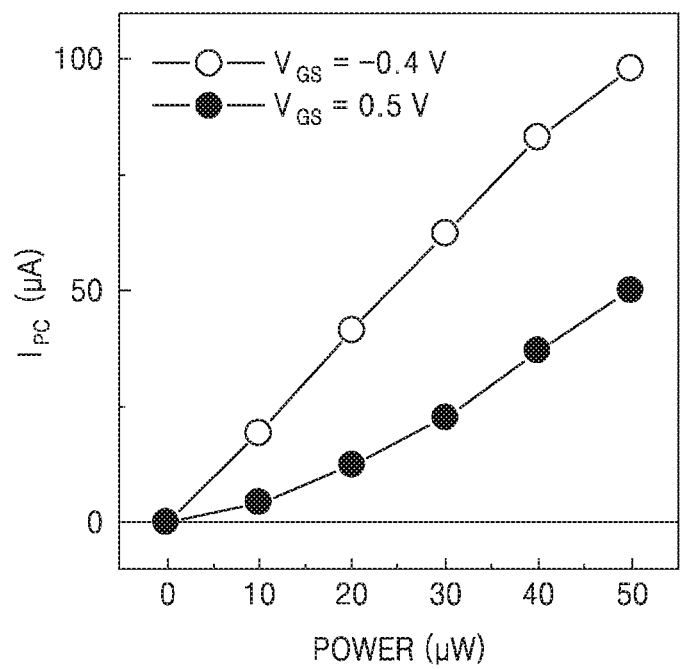
FIGS. 7A and 7B are graphs showing laser power dependence of a photocurrent, a Fermi level shift, and an induced carrier density change when light of which a wavelength is about $\lambda=3.5$ μm is illuminated on the optical sensor.
Figure 7B:
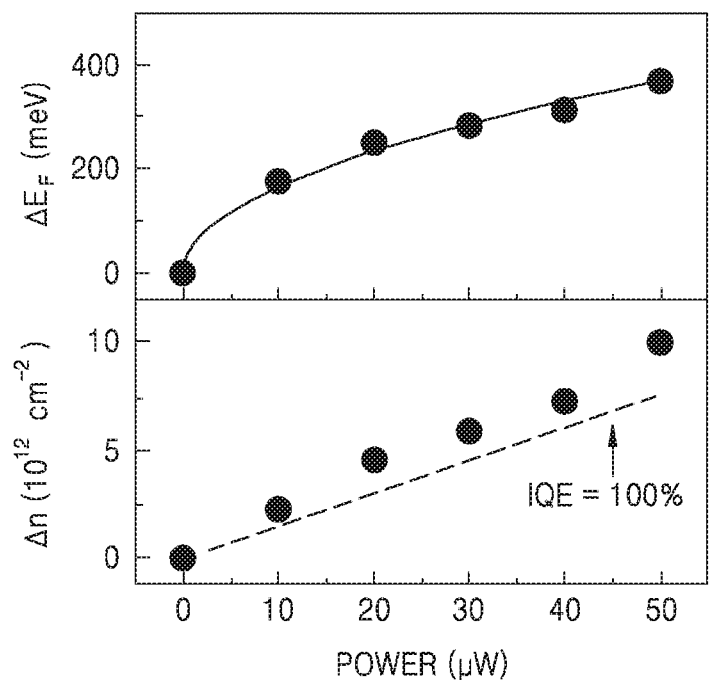

FIGS. 7A and 7B are graphs showing laser power dependence of the photocurrent $I_{PC}$, a Fermi level shift, and an induced carrier density change when light of which a wavelength is about $\lambda=3.5$ µm is illuminated on the optical sensor.

For example, as power of a laser beam of which a wavelength is about $\lambda=3.5$ µm increases, the induced photocurrent $I_{PC}$ may increase as shown in FIG. 7A. In this case, a Fermi level shift $\Delta E_F$ of graphene and an induced carrier density change $\Delta n$, which are induced by the laser power, may increase as the laser power increases, as shown in FIG. 7B.

An amount of the Fermi level shift $\Delta E_F$ of graphene may have a relationship with the induced carrier density change $\Delta n$ as represented in Equation 1. In Equation 1, C is capacitance, e is electron charge, u is frequency of an electromagnetic wave, $\hbar$ is reduced Planck constant (h/2p), $\Delta V_{shift}$ is a horizontal shift of the Dirac point voltage under light illumination.

$$\Delta E_F = \hbar v \sqrt{\pi C \frac{\Delta V_{Shift}}{e}} = \hbar v \sqrt{\pi \Delta n} \quad (1)$$

In the lower graph of FIG. 7B, a dotted line indicates a case in which internal quantum efficiency (IQE) is 100%, and the IQE is 100% or more for the optical sensor according to an exemplary embodiment based on the lower graph of FIG. 7B.

Table 1 shows comparison of performance parameters of various mid-IR optical sensors based on graphene.

TABLE 1

| Device structure | Responsivity (R) | Operating voltage at max. R | λ | Noise Equivalent Power (NEP) | Ref. |
|---|---|---|---|---|---|
| Graphene/Bi$_2$Se$_3$ heterojunction | 1.95 AW$^{-1}$ | $V_{GS} = -0.4$ V, $V_{DS} = 0.5$ V | 3.5 μm | ~5.13 × 10$^{-9}$WHz$^{-1/2}$ | This work |
| Graphene quantum dot-like-array structure at 12K | 0.4 AW$^{-1}$ | $V_{DS} = 0.02$ V | 10 μm | ~1.00 × 10$^{-8}$WHz$^{-1/2}$ | 1 |
| Graphene coupled to Si waveguide | 0.13 AW$^{-1}$ | $V_{DS} = 1.5$ V | 2.75 μm | ~5.55 × 10$^{-8}$WHz$^{-1/2}$ | 2 |
| Graphene/metallic antenna heterojunction | 0.4 VW$^{-1}$ | $V_{GS} = 5$ V, $V_{DS} = 0.6$ V | 4.45 μm | ~5.00 × 10$^{-9}$WHz$^{-1/2}$ | 3 |
| Graphene double-layer heterostructure | 1.1 AW$^{-1}$ | $V_{GS} = -60$ V, $V_{DS} = 1.5$ V | 3.2 μm | ~9.09 × 10$^{-9}$WHz$^{-1/2}$ | 4 |

In Table 1, reference (Ref.) "This work" indicates a sample having a graphene/Bi$_2$Se$_3$ heterojunction like the optical sensor according to an exemplary embodiment, Ref. "1" indicates a sample having a graphene quantum dot-like-array structure at 12 K, Ref. "2" indicates a sample having graphene coupled to an Si waveguide, Ref. "3" indicates a sample having a graphene/metallic antenna heterojunction, and Ref. "4" indicates a sample having a graphene double-layer heterostructure. The samples of Ref. "1," "2," "3," and "4" may correspond to conventional graphene-based mid-IR devices.

As shown in Table 1, the optical sensor sample according to an exemplary embodiment exhibits high responsivity at a lower gate voltage $V_{GS}$ or drain voltage $V_{DS}$ than the conventional graphene-based mid-IR devices.

Figure 8:
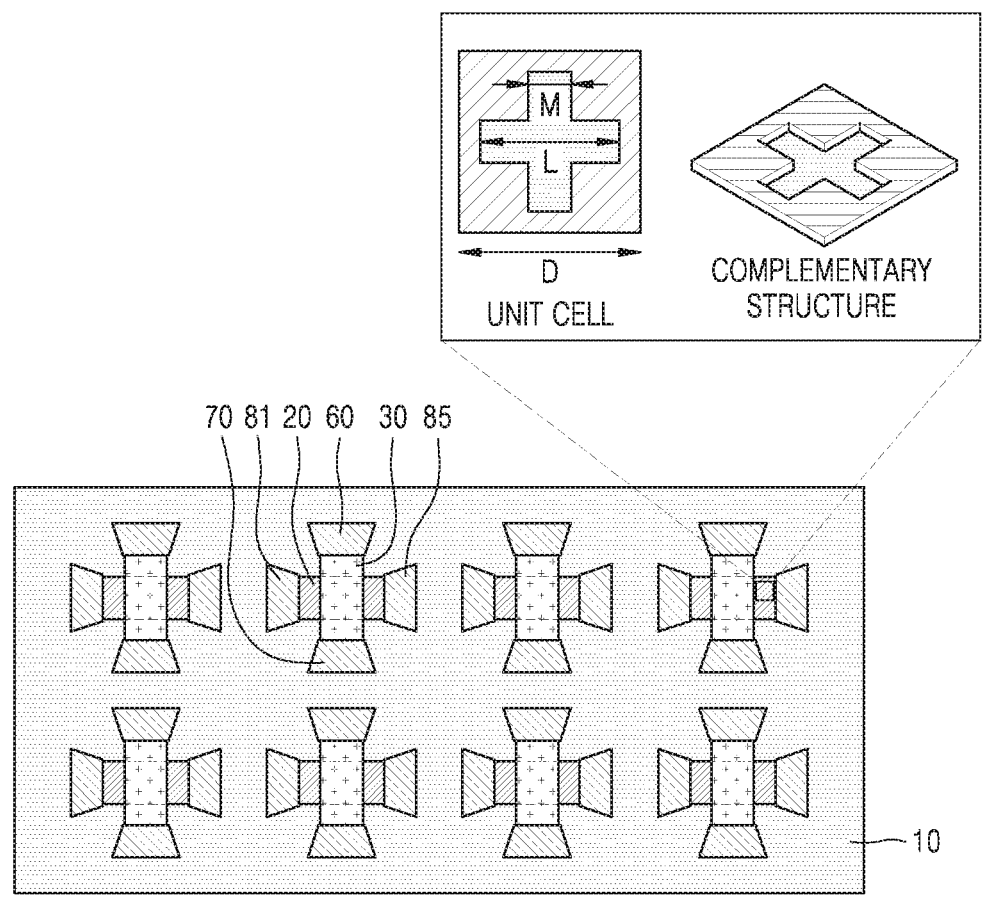
FIG. 8 illustrates an optical sensor according to another exemplary embodiment.

FIG. 8 illustrates an optical sensor according to another exemplary embodiment.

Referring to FIG. 8, the optical sensor may include an array of stacked structures of the topological insulator layer 20 and the graphene layer 30 on the substrate 10, e.g., a sapphire substrate.

That is, stacked structures of the topological insulator layer 20 and the graphene layer 30, which have an overlapping region of the topological insulator layer 20 and the graphene layer 30, the topological insulator layer 20 extending in a first direction, and the graphene layer 30 extending in a second direction other than the first direction, e.g., cross-stacked structures, may be arranged as an array on the substrate 10, e.g., a sapphire substrate. In this case, the topological insulator layer 20 and the graphene layer 30 may extend in directions crossing each other, respectively. Electrodes, e.g., the drain electrode 60 and the source electrode 70, may be disposed at both ends of the graphene layer 30, and electrodes 81 and 85 may also be disposed at both ends of the topological insulator layer 20. Similar to what is shown in FIGS. 1 and 2, in the optical sensor shown in FIG. 8, the ion gel layer 50 may also be formed so as to cover the graphene layer 30, and the side gate electrode 80 may also be formed so as to be electrically connected to the ion gel layer 50. In FIG. 8, illustration of the ion gel layer 50 covering the graphene layer 30, and the side gate electrode 80 is omitted for convenience.

As described above, the optical sensor may be formed in a structure in which the stacked structure, e.g., cross-stacked structures, of the topological insulator layer 20 and the graphene layer 30 are repetitively arranged in a two-dimensional array as shown in FIG. 8.

In this case, the topological insulator layer 20 of each stacked structure may be patterned so as to form a metamaterial. That is, the topological insulator layer 20 of each stacked structure may include a unit-cell array of the metamaterial.

The two-dimensional array arrangement structure of the stacked structures of the topological insulator layer 20 and the graphene layer 30 on the substrate 10 as shown in FIG. 8 may be formed through, for example, a following process.

The topological insulator layer 20 may be deposited as about 20 quantum layers (QLs) on the substrate 10, e.g., a sapphire substrate. Herein, a material forming the topological insulator layer 20 is a layered material, and one layer of the layered material is referred to as a QL.

The deposited topological insulator layer 20 may be patterned in a channel shape and patterned so as to form a metamaterial reacting in the mid-IR region in this channel, and then a structure in which the graphene layer 30 is located on the topological insulator layer 20 and an electrode is formed at an end of each layer may be formed. Thereafter, the ion gel layer 50 may be formed on the structure, and a resonance wavelength may be tuned through adjustment of a Fermi level of graphene by gating the ion gel layer 50.

A structure of the unit cell of the metamaterial formed on the topological insulator layer 20 of the optical sensor having the structure shown in FIG. 1, 2, or 8 may have a cross shape as shown in the top of FIG. 8. That is, a metamaterial having a cross-shaped slit pattern may be formed on a unit cell of the topological insulator layer 20, thereby reacting in the mid-IR region. When a size of each of dimensions D, L, and M of the structure of a unit cell is changed, an absorption spectrum may be changed. Herein, in the unit cell of the metamaterial having the cross-shaped slit pattern, the dimension D may denote a width of the unit cell, the dimension L may denote a length of the cross-shaped slit pattern, and the dimension M may denote a width of the cross-shaped slit pattern.

Figure 9:
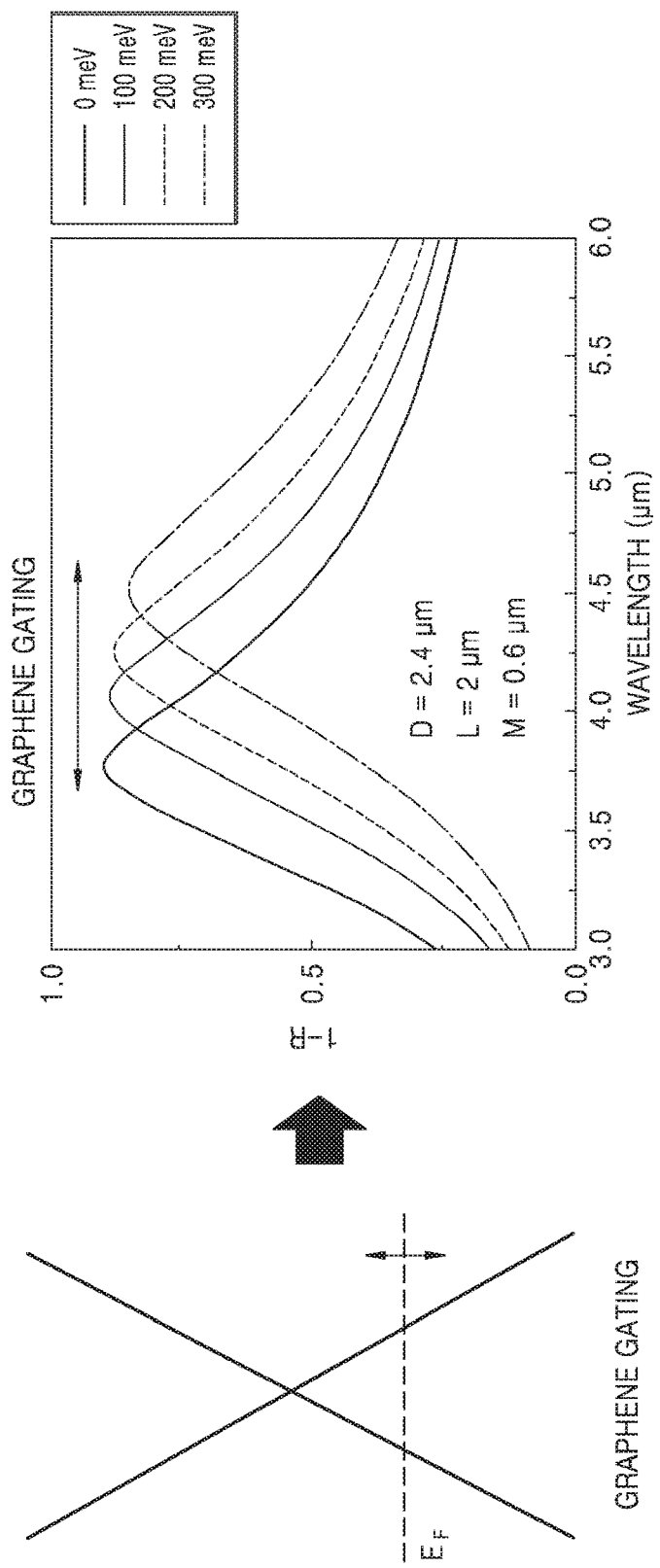
FIG. 9 illustrates shifting of a peak location of an absorption spectrum, i.e., a resonance absorption location, due to a graphene gating effect by which a Fermi level of graphene is changed, if a gating voltage to be applied through an ion gel layer is changed when a cross-shaped slit pattern is formed on a unit cell of a metamaterial.

FIG. 9 illustrates shifting of a peak location of an absorption spectrum, i.e., a resonance absorption location, due to a graphene gating effect by which a Fermi level of graphene is changed, if a gating voltage to be applied through the ion gel layer 50 is changed when a cross-shaped slit pattern is formed on a unit cell of a metamaterial.

Figure 10A:
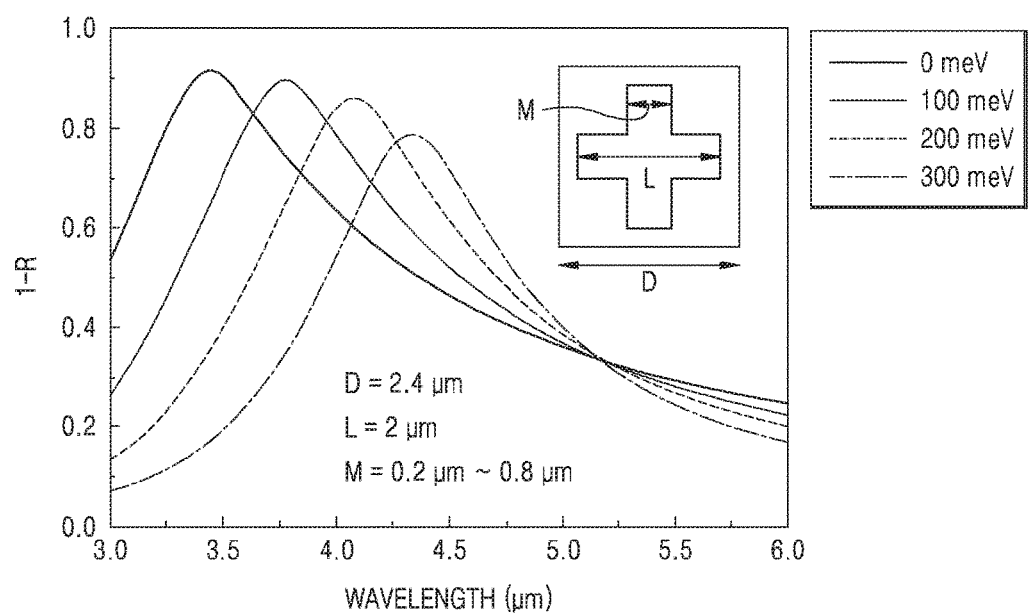
FIGS. 10A and 10B are graphs showing absorption spectra according to a change of each of dimensions D, L, and M of a cross-shaped slit pattern of a unit cell of a metamaterial when the cross-shaped slit pattern is formed on the unit cell.
Figure 10B:
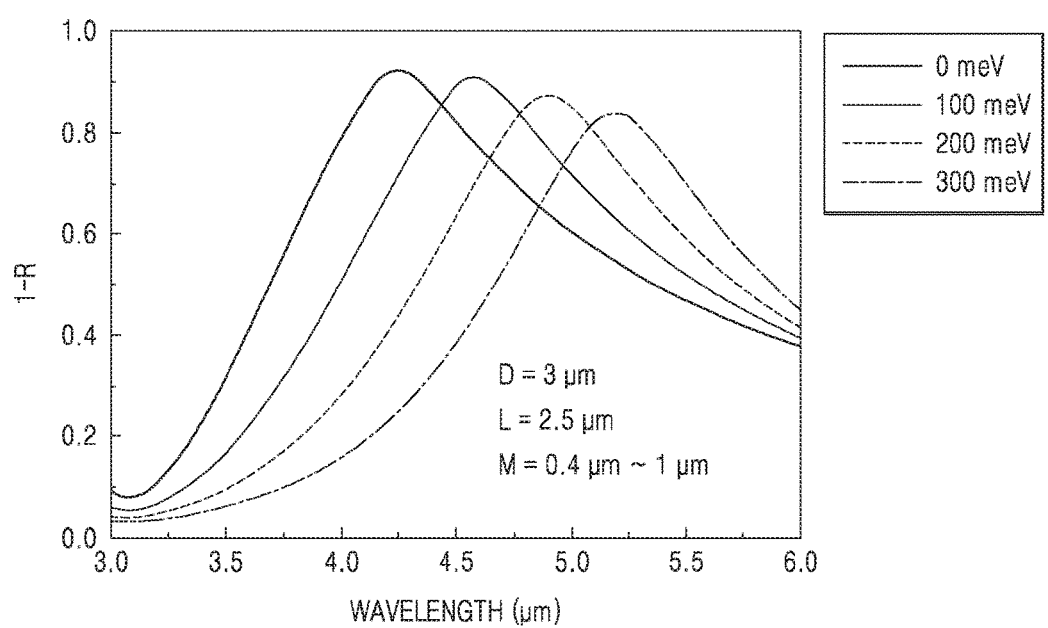

FIGS. 10A and 10B are graphs showing absorption spectra according to a change of each of the dimensions D, L, and M of a cross-shaped slit pattern of a unit cell of a metamaterial when the cross-shaped slit pattern is formed on the unit cell. As shown in FIGS. 10A and 10B, when each of the dimensions D, L, and M is changed, a wavelength location corresponding to a peak of an absorption spectrum may be changed. In addition, when a gating voltage to be applied through the ion gel layer 50 is changed, a peak location of an absorption spectrum, i.e., a resonance absorption location, may be shifted due to a graphene gating effect by which a Fermi level of graphene is changed.

FIGS. 9, 10A, and 10B show tuning of a resonance absorption wavelength when a Fermi level of graphene is shifted by 0 meV, 100 meV, 200 meV, and 300 meV.

As shown in FIGS. 9 and 10A, for a cross-shaped slit pattern resonating at about 3.5 μm when a Fermi level of graphene is located at 0 meV, if the Fermi level is shifted to 300 meV, a resonance wavelength may be tuned by about 1.5-2 μm.

In addition, as shown in FIG. 10B, even for a cross-shaped slit pattern resonating at about 4.0 μm when a Fermi level of graphene is located at 0 meV, if the Fermi level is shifted to 300 meV, a resonance wavelength may be tuned by about 1 μm.

As described above, according to the dimensions D, L, and M of a cross-shaped slit pattern of a unit cell of a metamaterial, when a Fermi level of graphene is changed, a resonance wavelength may be tuned by about 1-2 μm.

The structure of the unit cell of the metamaterial formed on the topological insulator layer 20 of the optical sensor having the structure shown in FIG. 1, 2, or 8 may have various shapes of slit patterns instead of the cross-shaped slit pattern.

Figure 11A:
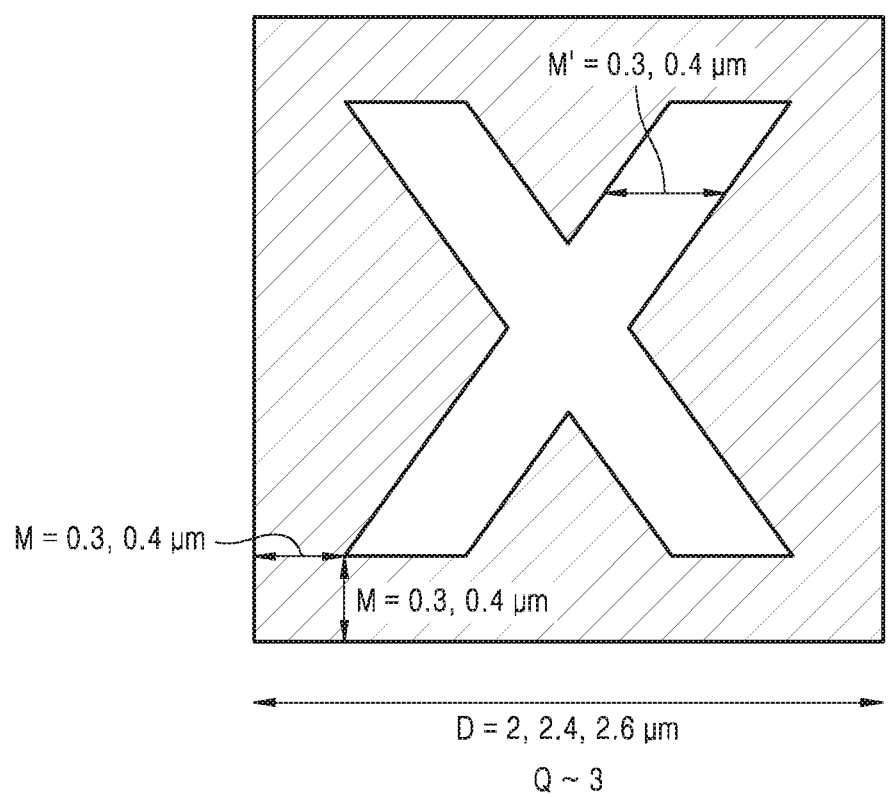
FIG. 11A shows an example in which a slit pattern of a unit cell of a metamaterial is formed in an X shape.
Figure 11B:
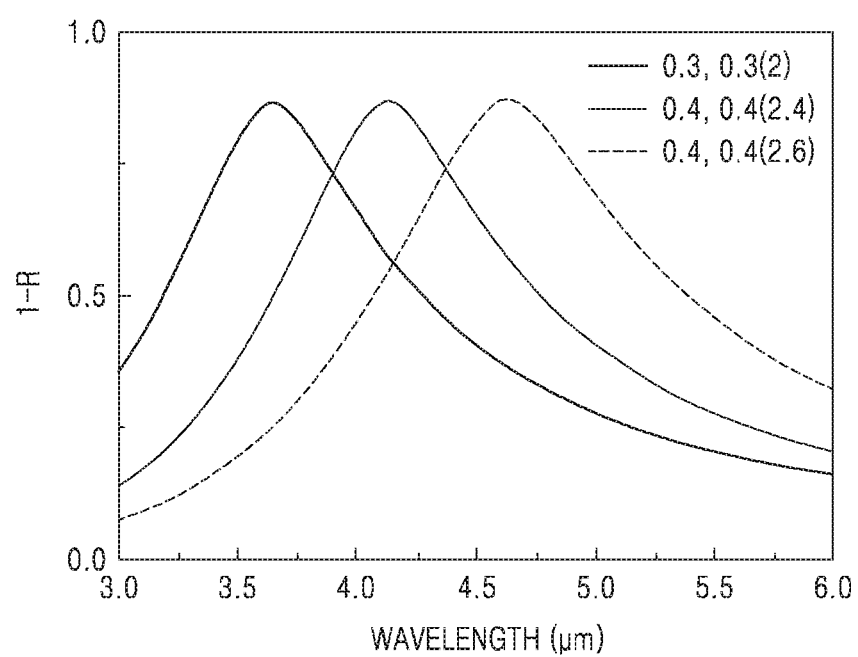
FIG. 11B is a graph showing absorption spectra according to dimensions D, M, and M' of the X-shaped slit pattern of FIG. 11A and showing that a resonance wavelength may be changed according to the dimensions D, M, and M' of the X-shaped slit pattern.

FIG. 11A shows an example in which a slit pattern of a unit cell of a metamaterial is formed in an X shape. FIG. 11B is a graph showing absorption spectra according to dimensions D, M, and M' of the X-shaped slit pattern of FIG. 11A and showing that a resonance wavelength may be changed according to the dimensions D, M, and M' of the X-shaped slit pattern. In FIG. 11A, D denotes a width of the unit cell, M denotes a minimum distance from a boundary of the unit cell to an X-shaped slit, and M' denotes a width of the X-shaped slit.

Figure 12A:
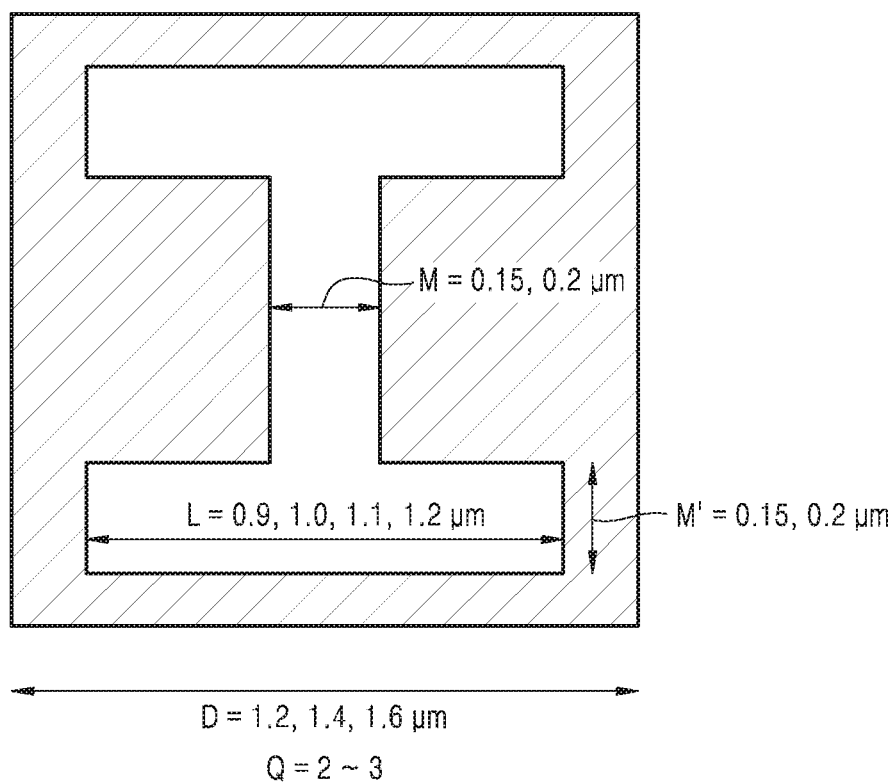
FIG. 12A shows an example in which a slit pattern of a unit cell of a metamaterial is formed in an I shape.
Figure 12B:
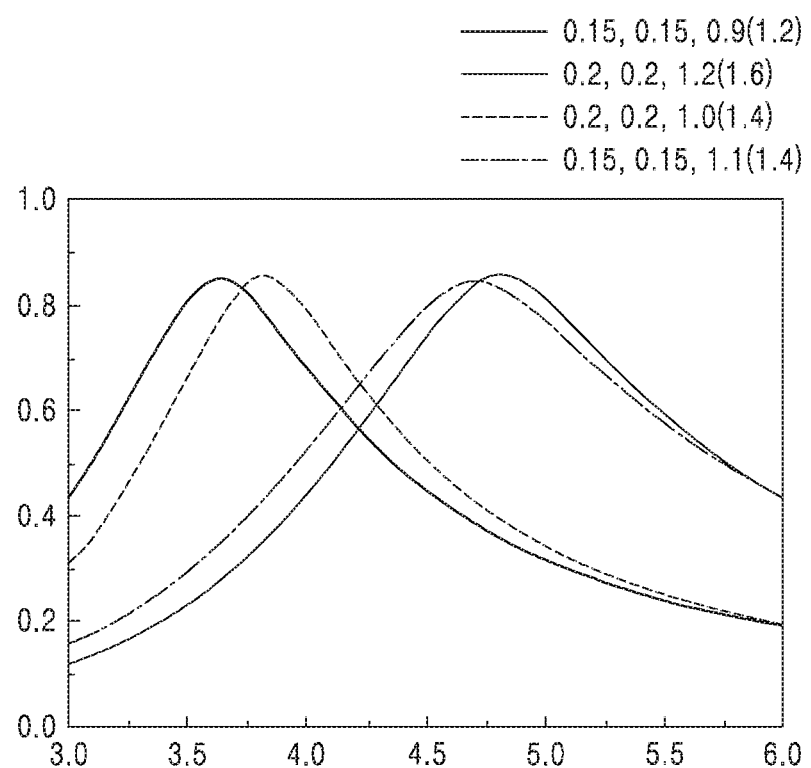
FIG. 12B is a graph showing absorption spectra according to dimensions D, L, M, and M' of the I-shaped slit pattern of FIG. 12A and showing that a resonance wavelength may be changed according to the dimensions D, L, M, and M' of the I-shaped slit pattern.

FIG. 12A shows an example in which a slit pattern of a unit cell of a metamaterial is formed in an I shape. FIG. 12B is a graph showing absorption spectra according to dimensions D, L, M, and M' of the I-shaped slit pattern of FIG. 12A and showing that a resonance wavelength may be changed according to the dimensions D, L, M, and M' of the I-shaped slit pattern. In FIG. 12A, D denotes a width of the unit cell, M and M' denote widths of an I-shaped slit, and L denotes a length of the I-shaped slit.

As shown in FIGS. 11A, 11B, 12A, and 12B, even when a slit pattern of a unit cell of a metamaterial changes from a cross shape to another shape, e.g., an X shape or an I shape, resonance of an absorption spectrum occurs at a band of about 3-4 μm. Therefore, when a slit pattern of a unit cell of a metamaterial is designed to a cross shape, an X shape, an I shape, or the like, and dimensions of the slit pattern is properly designed, an optical sensor of which absorption resonance occurs in a desired mid-IR wavelength band and of which a resonance absorption wavelength is tuned by 1-2 μm by adjusting a Fermi level of graphene may be obtained. Although cases in which a slit pattern of a unit cell of a metamaterial is a cross shape, an X shape, and an I shape have been illustrated, these cases are only illustrative, and the embodiments are not limited thereto. That is, a unit cell of a metamaterial may be formed as various slit patterns so that resonance of an absorption spectrum is obtained in a desired wavelength band, i.e., a mid-IR wavelength band.

As another example, when a size of a pattern of a unit cell of a metamaterial on the topological insulator layer 20 having a high refractive index is larger, resonance of an absorption spectrum may occur in a longer wavelength. That is, a resonance wavelength band of an absorption spectrum may be adjusted according to a refractive index of the topological insulator layer 20 and a size of a pattern of a unit cell of a metamaterial.

As described above, by patterning a slit pattern on the topological insulator layer 20 so as to form a metamaterial, when mid-IR light is illuminated on an optical sensor, a photocurrent may be detected through the electrodes 60 and 70 prepared at both ends of the graphene layer 30.

According to the optical sensors according to an aspect of an exemplary embodiment, a resonance characteristic of an absorption spectrum in a certain wavelength band is exhibited, and when a gating voltage to be applied to the ion gel layer 50 is adjusted, a resonance location of the absorption spectrum may be adjusted through adjustment of a Fermi level of graphene, and thus a type of a material may be identified without a separate spectrometer.

Therefore, the optical sensors according to an aspect of an exemplary embodiment may be applied as an optical sensor to mobile health and the like.

An optical sensor having good reaction wavelength selectivity and responsivity may be implemented by applying a stacked layer of a topological insulator layer and a graphene layer thereto. In addition, an optical sensor having good responsivity in an IR region may be realized by patterning the topological insulator layer such that the topological insulator layer includes a unit-cell array of a metamaterial. Furthermore, a resonance absorption wavelength may be tuned by gating the graphene layer to adjust a Fermi level of graphene.

It should be understood that embodiments described herein should be considered in a descriptive sense only and not for purposes of limitation. Descriptions of features or aspects within an exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An optical sensor comprising:
a substrate;
a topological insulator layer formed on the substrate;
an oxide layer formed on the topological insulator layer;
a graphene layer stacked on the oxide layer; and
a dielectric layer covering the graphene layer, wherein the dielectric layer is an ion gel layer comprising ion gel, and a graphene Fermi level of the graphene layer is adjusted through the ion gel layer to tune a resonance absorption location of the topological insulator layer.

2. The optical sensor of claim 1, wherein the topological insulator layer is patterned so as to form a metamaterial and comprises a unit-cell array of the metamaterial.

3. The optical sensor of claim 2, wherein a unit cell of the unit-cell array has a slit pattern having at least one of a cross shape, an X shape, and an I shape.

4. The optical sensor of claim 2, wherein stacked structures of the topological insulator layer and the graphene layer are provided, the stacked structures having an overlapping region of the topological insulator layer and the graphene layer, and
wherein the topological insulator layer extends in a first direction, and the graphene layer extends in a second direction other than the first direction.

5. The optical sensor of claim 4, wherein the first direction and the second direction cross each other.

6. The optical sensor of claim 4, wherein an array of the stacked structures of the topological insulator layer and the graphene layer is provided.

7. The optical sensor of claim 1, wherein electrodes are provided at both ends of the graphene layer.

8. The optical sensor of claim 1, wherein the oxide layer has a thickness of 10 nm or less.

9. The optical sensor of claim 1, further comprising a side gate electrode electrically connected to the ion gel layer and configured to gate the ion gel layer to adjust a graphene Fermi level of the graphene layer.

10. The optical sensor of claim 1, wherein the graphene Fermi level of the graphene layer is adjusted by an amount in a range of 1-2 μm through the ion gel layer to tune the resonance absorption location of the topological insulator layer.

11. The optical sensor of claim 1, wherein the topological insulator layer is prepared such that resonance absorption occurs within a range of 3-4 μm.

12. The optical sensor of claim 11, wherein a resonance absorption location of the topological insulator layer is tuned by an amount in a range of 1-2 μm by adjusting a graphene Fermi level of the graphene layer through the ion gel layer.

13. The optical sensor of claim 1, wherein the topological insulator layer is prepared such that resonance absorption occurs within a range of 3-4 μm.

14. The optical sensor of claim 1, wherein stacked structures of the topological insulator layer and the graphene layer are provided, the stacked structures having an overlapping region of the topological insulator layer and the graphene layer, and
wherein the topological insulator layer extends in a first direction, and the graphene layer extends in a second direction other than the first direction.

15. The optical sensor of claim 14, wherein the first direction and the second direction cross each other.

16. The optical sensor of claim 14, wherein electrodes are provided at both ends of the graphene layer.

* * * * *